(12) United States Patent
Kim et al.

(10) Patent No.: US 12,336,422 B2
(45) Date of Patent: Jun. 17, 2025

(54) METHOD OF AGING A DISPLAY DEVICE

(71) Applicant: SAMSUNG DISPLAY CO., LTD., Yongin-si (KR)

(72) Inventors: Choong-Hwa Kim, Yongin-si (KR); Taekyoung Kim, Yongin-si (KR); Jian Shin, Yongin-si (KR); Hun-Tae Kim, Yongin-si (KR); Wonjin Seo, Yongin-si (KR); Yongjun Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/435,225

(22) Filed: Feb. 7, 2024

(65) Prior Publication Data

US 2024/0268209 A1 Aug. 8, 2024

(30) Foreign Application Priority Data

Feb. 8, 2023 (KR) .................. 10-2023-0016705

(51) Int. Cl.
*G09G 3/3291* (2016.01)
*H10K 71/00* (2023.01)

(52) U.S. Cl.
CPC ......... *H10K 71/831* (2023.02); *G09G 3/3291* (2013.01); *G09G 2300/0819* (2013.01); *G09G 2320/045* (2013.01)

(58) Field of Classification Search
CPC ............... H10K 71/831; G09G 3/3291; G09G 2300/0819; G09G 2320/045
See application file for complete search history.

(56) References Cited

U.S. PATENT DOCUMENTS

2018/0075798 A1* 3/2018 Nho .................. G09G 3/32
2019/0013473 A1* 1/2019 Tu .................. G01N 21/27

FOREIGN PATENT DOCUMENTS

KR 10-0846503 7/2008

* cited by examiner

*Primary Examiner* — Robert J Michaud
(74) *Attorney, Agent, or Firm* — F. CHAU & ASSOCIATES, LLC

(57) ABSTRACT

A method of aging a display device includes: inputting a display device including a plurality of pixels into an aging chamber, reaching a preset condition of the display device, sensing each of the plurality of pixels, compensating each of the plurality of pixels, and aging the display device.

21 Claims, 5 Drawing Sheets

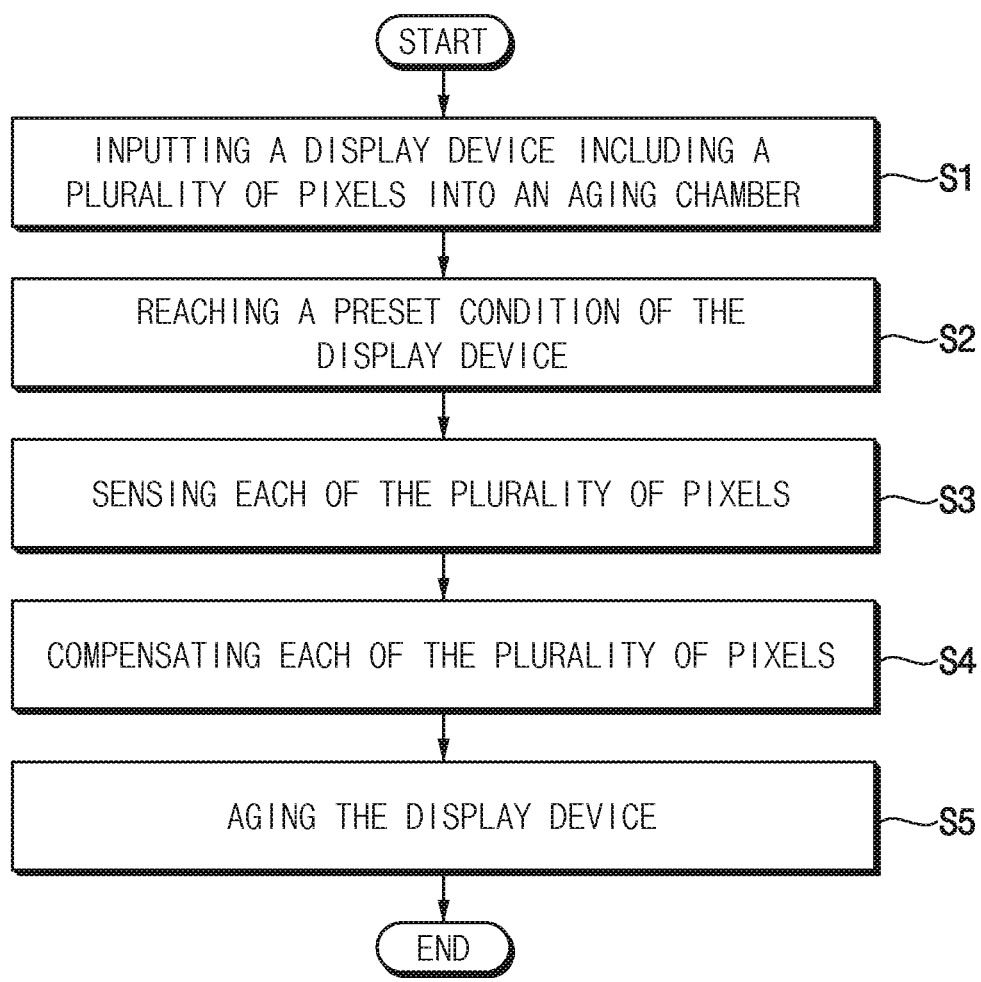

METHOD OF AGING A DISPLAY DEVICE

CROSS-REFERENCE TO RELATED APPLICATION(S)

This application claims priority under 35 U.S.C. § 119 to Korean Patent Application No. 10-2023-0016705, filed on Feb. 8, 2023, in the Korean Intellectual Property Office (KIPO), the entire contents of which are herein incorporated by reference.

BACKGROUND

1. Technical Field

Embodiments described herein relate to a method of aging a display device.

2. Description of the Related Art

A variety of display devices have been developed. One example is an organic light emitting diode display. In such a display, a light emitting layer may deteriorate as emission time increases. Accordingly, the life of the organic light emitting display device may be shortened and light efficiency may be reduced.

SUMMARY

In accordance with one or more embodiments, a method of aging a display device includes inputting a display device including a plurality of pixels into an aging chamber, reaching a preset condition of the display device, sensing at least one electrical characteristic of each of the plurality of pixels, compensating each of the plurality of pixels, and aging the display device.

In an embodiment, reaching the preset condition of the display device may include applying heat to cause the display device to reach a preset temperature of the display device.

In an embodiment, the preset temperature may be higher than internal temperature of the aging chamber.

In an embodiment, the display device may be heated inside the aging chamber for a preset time to reach the preset temperature.

In an embodiment, temperature of the display device may be lower than or equal to the preset temperature.

In an embodiment, each of the plurality of pixels may include a transistor.

In an embodiment, the transistor may include a source electrode, a drain electrode, a gate electrode, and an active pattern.

In an embodiment, the display device may further include a sensing unit to sense the at least one electrical characteristic of each of the plurality of pixels.

In an embodiment, the sensing each of the plurality of pixels may include measuring an electrical characteristic of the transistor using the sensing unit.

In an embodiment, the transistor may be a driving transistor.

In an embodiment, the electrical characteristic may be a driving current flowing between the source electrode and the drain electrode.

In an embodiment, the display device may further include a compensation unit and a data driver.

In an embodiment, the compensating each of the plurality of pixels may include generating sensing data based on the measured electrical characteristic using the sensing unit.

In an embodiment, the compensating each of the plurality of pixels may further include outputting the sensing data to the compensation unit by using the sensing unit.

In an embodiment, the compensating each of the plurality of pixels may further include calculating a compensation value based on the sensing data by using the compensation unit.

In an embodiment, the compensating each of the plurality of pixels may further include generating compensation data based on the compensation value using the compensation unit.

In an embodiment, the compensating each of the plurality of pixels may further include outputting the compensation data to the data driver using the compensation unit.

In an embodiment, the aging the display device may include adjusting a data voltage based on the compensation data using the data driver.

In an embodiment, the aging the display device may further include applying the adjusted data voltage to each of the plurality of pixels by using the data driver.

In an embodiment, temperature inside the aging chamber may be higher than temperature outside the aging chamber.

A method of aging a display device according to an embodiment may include sensing and compensating a transistor included in each of a plurality of pixels before aging the display device. Accordingly, an aging effect may be uniform over the plurality of pixels.

In addition, the method of aging the display device according to an embodiment may include reaching a preset condition of the display device before sensing and compensating the transistor contained in each of the plurality of pixels. That is, the method of aging the display device may include reaching a preset temperature of the display device. A threshold voltage of the transistor may vary depending on temperature. When the display device reaches the preset temperature, temperature of the display device may no longer change. Accordingly, a value of the threshold voltage may be fixed. Accordingly, the transistor may be sensed and compensated with high precision.

Automatically sensing and compensating the transistor may be performed after reaching the preset condition of the display device. Accordingly, an aging effect of the display device may be constant over the plurality of pixels without separate facilities or equipment.

In accordance with one or more embodiments, a method for aging a display device includes heating the display device to a preset temperature in an aging chamber; sensing driving current in each of a plurality of pixels in the display device; generating compensation data based on the driving current sensed for each of the plurality of pixels; and generating adjusted data for the plurality of pixels based on the compensation data, wherein the adjusted data causes the driving current in each of the plurality of pixels to substantially equal one another.

BRIEF DESCRIPTION OF THE DRAWINGS

Illustrative, non-limiting embodiments will be more clearly understood from the following detailed description in conjunction with the accompanying drawings.

FIG. 5 is a flowchart illustrating a method of aging a display device according to an embodiment.

DETAILED DESCRIPTION OF THE EMBODIMENTS

Figure 1:
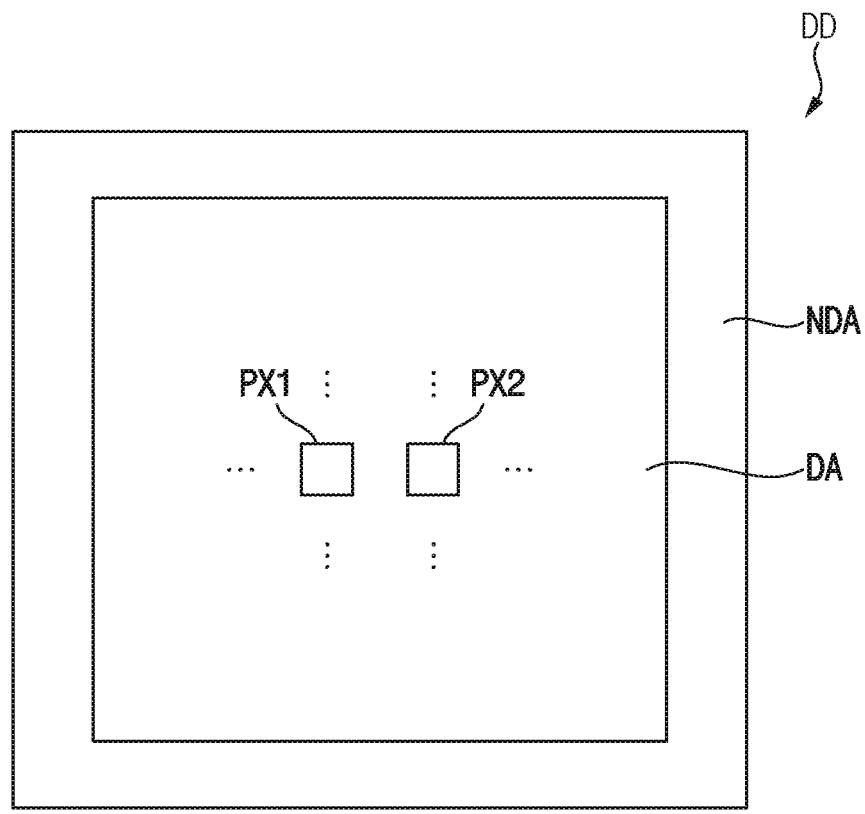
FIG. 1 is a plan view illustrating a display device which may be subject to an aging method according to an embodiment.
Figure 1:
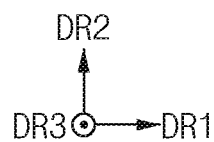

Hereinafter, display devices in accordance with embodiments will be described in more detail with reference to the accompanying drawings. The same reference numerals are used for the same components in the drawings, and redundant descriptions of the same components will be omitted.

FIG. 1 is a plan view illustrating a display device DD subject to an aging method according to an embodiment. Referring to FIG. 1, the display device DD may include a display area DA and a non-display area NDA. The display area DA may be capable of generating light or displaying an image by adjusting the transmittance of light provided from an external light source. The non-display area NDA may be an area that does not display an image. In addition, the non-display area NDA may partially or completely surround at least a portion of the display area DA.

A plurality of pixels may be disposed in the display area DA. For example, a first pixel PX1 and a second pixel PX2 may be disposed in the display area DA. Each of the plurality of pixels may emit light. For example, each of the first pixel PX1 and the second pixel PX2 may emit light. The plurality of pixels may be repeatedly arranged along a first direction DR1 and a second direction DR2 crossing the first direction DR1. For example, the second pixel PX2 may be spaced apart from the first pixel PX1 in the first direction DR1. The first direction DR1 and the second direction DR2 crossing the first direction DR1 may be defined as shown by arrows in FIG. 1. In addition, a third direction DR3 may be perpendicular to a plane formed by the first direction DR1 and the second direction DR2.

Figure 2:
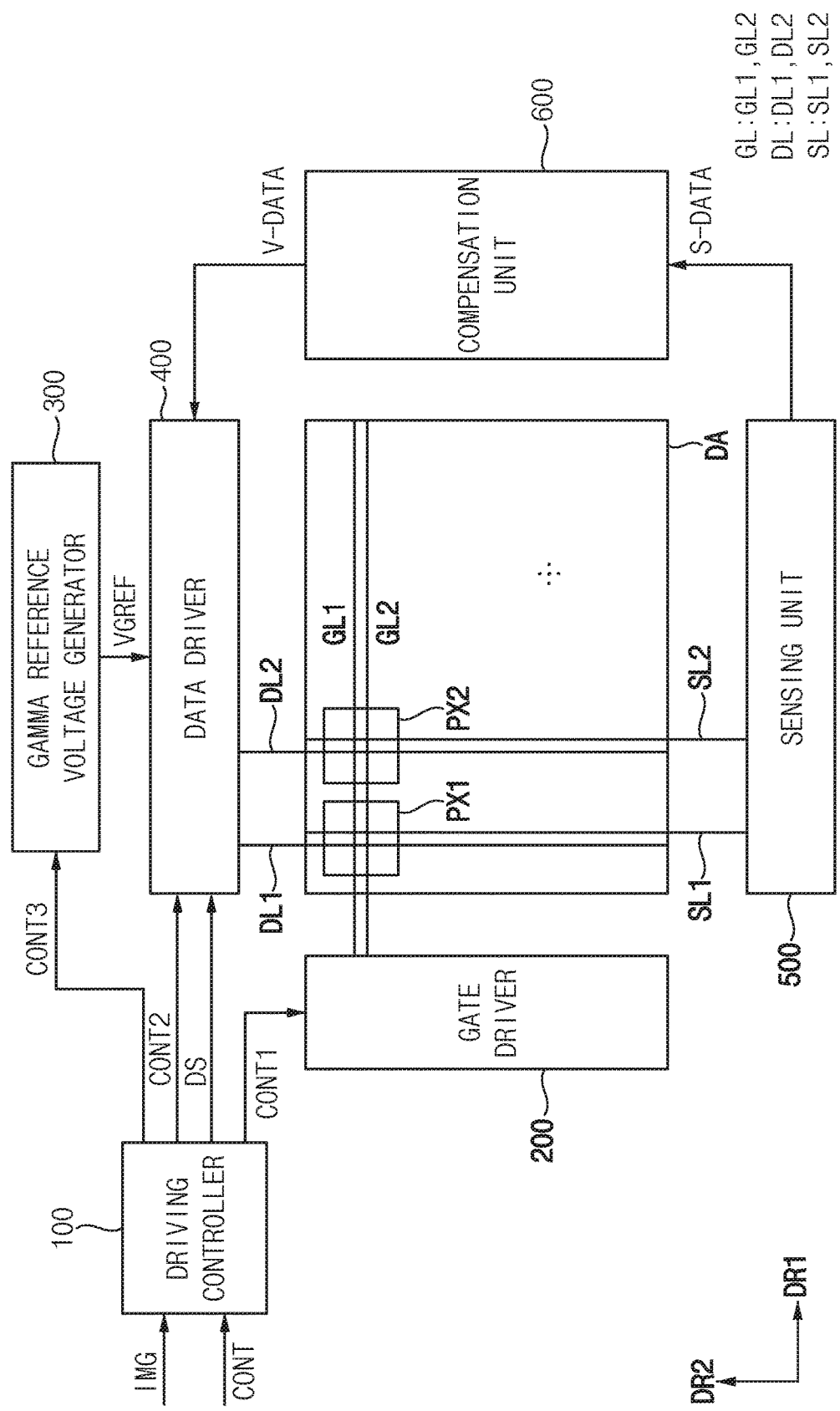
FIG. 2 is a block diagram illustrating an embodiment of the display device of FIG. 1.

FIG. 2 is a block diagram illustrating an embodiment of the display device DD of FIG. 1. Referring to FIGS. 1 and 2, the display device DD may include a driving unit disposed in the non-display area NDA. The driving unit may include a driving controller 100, a gate driver 200, a gamma reference voltage generator 300, a data driver 400, a sensing unit 500, and a compensation unit 600.

The display area DA may include a plurality of pixels including a first pixel PX1, a second pixel PX2, a plurality of scan lines GL, a plurality of data lines DL, and a plurality of sensing lines SL. For example, the scan lines GL may include a first scan line GL1 and a second scan line GL2. In addition, the data lines DL may include a first data line DL1 and a second data line DL2. In addition, the sensing lines SL may include a first sensing line SL1 and a second sensing line SL2.

The first pixel PX1 may be electrically connected to each of the first scan line GL1, the second scan line GL2, the first data line DL1, and the first sensing line SL1. In addition, the second pixel PX2 may be electrically connected to each of the first scan line GL1, the second scan line GL2, the second data line DL2, and the second sensing line SL2. Each of the first scan line GL1 and the second scan line GL2 may extend in the first direction DR1. In addition, each of the first data line DL1, the second data line DL2, the first sensing line SL1, and the second sensing line SL2 may extend in the second direction DR2.

The driving controller 100 may receive input image data IMG and an input control signal CONT from an external device, e.g., a host. In an embodiment, the input image data IMG may include red image data, green image data, and blue image data. In another embodiment, the input image data IMG may include white image data. In another embodiment, the input image data IMG may include a different combination of color data, e.g., magenta image data, yellow image data, and cyan image data. The input control signal CONT may include a master clock signal and a data enable signal. The input control signal CONT may further include a vertical synchronization signal and a horizontal synchronization signal.

The driving controller 100 may generate a first control signal CONT1, a second control signal CONT2, a third control signal CONT3, and a data signal DS based on the input image data IMG and the input control signal CONT. The driving controller 100 may generate the first control signal CONT1 for controlling an operation of the gate driver 200 based on the input control signal CONT and may output the first control signal CONT1 to the gate driver 200. The first control signal CONT1 may include a vertical start signal and a gate clock signal.

The driving controller 100 may generate the second control signal CONT2 for controlling an operation of the data driver 400 based on the input control signal CONT and may output the second control signal CONT2 to the data driver 400. The second control signal CONT2 may include a horizontal start signal and a load signal.

The driving controller 100 may generate the third control signal CONT3 for controlling an operation of the gamma reference voltage generator 300 based on the input control signal CONT and may output the third control signal CONT3 to the gamma reference voltage generator 300.

The driving controller 100 may generate the data signal DS based on the input image data IMG. The driving controller 100 may output the data signal DS to the data driver 400.

The gate driver 200 may generate a plurality of gate signals for driving the scan lines GL in response to the first control signal CONT1 received from the driving controller 100. The gate driver 200 may output the plurality of gate signals to respective ones of the scan line GL. The plurality of gate signals may include, for example, a data write gate signal, a sensing gate signal, or the like.

The gamma reference voltage generator 300 may generate a gamma reference voltage VGREF in response to the third control signal CONT3 input from the driving controller 100. The gamma reference voltage generator 300 may provide the gamma reference voltage VGREF to the data driver 400. The gamma reference voltage VGREF may have a value corresponding to each data signal DS. For example, the gamma reference voltage generator 300 may be spaced apart from the data driver 400 in the second direction DR2. However, this disclosure is not limited to this, and the gamma reference voltage generator 300 may be disposed in the driving controller 100 or the data driver 400 in another embodiment.

The data driver 400 may receive the second control signal CONT2 and the data signal DS from the driving controller 100. In addition, the data driver 400 may receive the gamma reference voltage VGREF from the gamma reference voltage generator 300. The data driver 400 may convert the data signal DS into an analog data voltage (e.g., a data voltage DATA of FIG. 3) using the gamma reference voltage VGREF. The data driver 400 may output the data voltage to a corresponding one of the data lines DL.

Figure 3:
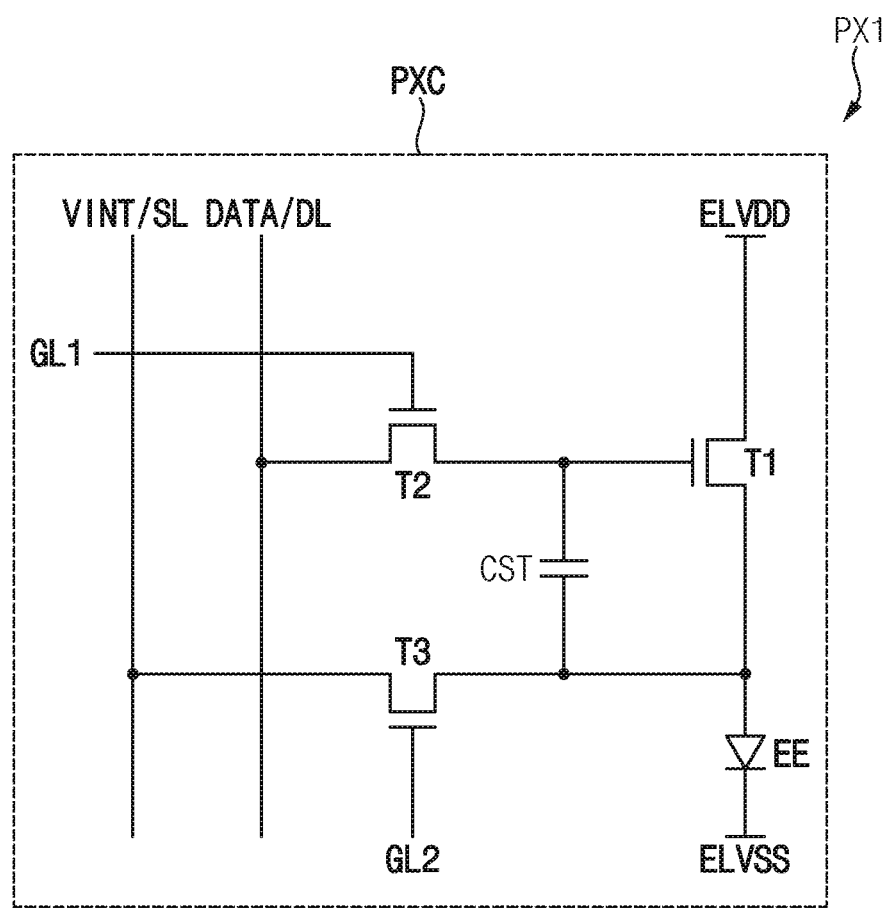
FIG. 3 is a circuit diagram illustrating an embodiment of a pixel included in the display device of FIG. 1.

The sensing unit 500 may generate an initialization voltage (e.g., an initialization voltage VINT of FIG. 3). The sensing unit 500 may output the initialization voltage to corresponding ones of the sensing lines SL. In addition, the sensing unit 500 may measure electrical characteristics of each of the plurality of pixels. For example, the sensing unit 500 may measure electrical characteristics of the first pixel PX1 and the second pixel PX2. The sensing unit 500 may generate sensing data S-DATA based on the measured electrical characteristics. The sensing unit 500 may output the sensing data S-DATA to the compensation unit 600.

The compensation unit 600 may calculate a compensation value for compensating each of the plurality of pixels based on the sensing data S-DATA. For example, the compensation unit 600 may calculate a compensation value for compensating each of the first pixel PX1 and the second pixel PX2. The compensation unit 600 may generate compensation data V-DATA based on the compensation value. The compensation unit 600 may output the compensation data V-DATA to the data driver 400.

FIG. 2 shows an example in which the gate driver 200 is spaced apart from the display area DA in a direction opposite to the first direction DR1, and the compensation unit 600 is spaced apart from the display area DA in the first direction DR1, but the gate driver 200 and/or the compensation unit 600 may be provided at different locations than indicated above. For example, each of the gate driver 200 and the compensation unit 600 may be spaced apart from the display area DA in a direction opposite to the first direction DR1.

In addition, FIG. 2 shows an example in which the data driver 400 is spaced apart from the display area DA in the second direction DR2, and the sensing unit 500 is spaced apart from the display area DA in a direction opposite to the second direction DR2, but the data driver 400 and/or the sensing unit 500 may be provided at different locations than indicated above. For example, each of the data driver 400 and the sensing unit 500 may be spaced apart from the display area DA in the second direction DR2.

FIG. 3 is a circuit diagram illustrating an embodiment of pixel PX1 included in the display device of FIG. 1. The remaining pixels in the display area may have a structure like pixel PX1 as shown in FIG. 3.

Referring to FIG. 3, the first pixel PX1 may include a pixel circuit PXC. The pixel circuit PXC may include a light emitting element EE, a first transistor T1, a second transistor T2, a third transistor T3, and a storage capacitor CST. The first transistor T1 includes a gate electrode, a first electrode, and a second electrode. The gate electrode of the first transistor T1 may be connected to a second electrode of the second transistor T2. In addition, a first power supply voltage ELVDD may be coupled to the first electrode of the first transistor T1. In addition, the second electrode of the first transistor T1 may be connected to a first electrode of the light emitting element EE. Accordingly, the first transistor T1 may apply a driving current to the light emitting element EE. The first transistor T1 may operate as a driving transistor.

The second transistor T2 may include a gate electrode, a first electrode, and a second electrode. The gate electrode of the second transistor T2 may be connected to the first scan line GL1. In addition, the first electrode of the second transistor T2 may be connected to the data line DL. In addition, the second electrode of the second transistor T2 may be connected to the gate electrode of the first transistor T1. Accordingly, the second transistor T2 may transmit the data voltage DATA applied from the data line DL to the gate electrode of the first transistor T1 according to a gate signal applied from the first scan line GL1. Thus, the second transistor T2 may operate as a switching transistor.

The third transistor T3 may include a gate electrode, a first electrode, and a second electrode. The gate electrode of the third transistor T3 may be connected to the second scan line GL2. In addition, the first electrode of the third transistor T3 may be connected to the sensing line SL. The second electrode of the third transistor T3 may be connected to the first electrode of the light emitting element EE and the second electrode of the first transistor T1. Accordingly, the third transistor T3 may transmit the initialization voltage VINT applied from the sensing line SL to the first electrode of the light emitting element EE according to a gate signal applied from the second scan line GL2. Thus, the third transistor T3 may operate as a sensing or initialization transistor.

The light emitting element EE may include the first electrode and a second electrode. The second electrode of the light emitting element EE may be connected to a second power supply voltage ELVSS. For example, the second power supply voltage ELVSS may be a low power supply voltage, and the first power supply voltage ELVDD may be a high power supply voltage.

The storage capacitor CST may be connected between the second electrode of the first transistor T1 and the gate electrode of the first transistor T1. Accordingly, the storage capacitor CST may maintain (or store) a constant data voltage DATA applied to the gate electrode of the first transistor T1.

FIG. 3 illustrates an example in which the pixel circuit PXC includes first the transistor T1, the second transistor T2, the third transistors T3, and a storage capacitor CST. That is, FIG. 3 illustrates an example in which the pixel circuit PXC includes a 3T-1C (3Transistor-1Capacitor) structure. However, this disclosure is not limited to it, and the pixel circuit PXC may contain other structures such as, but not limited to, a 2T-1C structure, a 7T-1C structure, or a 6T-1C structure.

Figure 4:
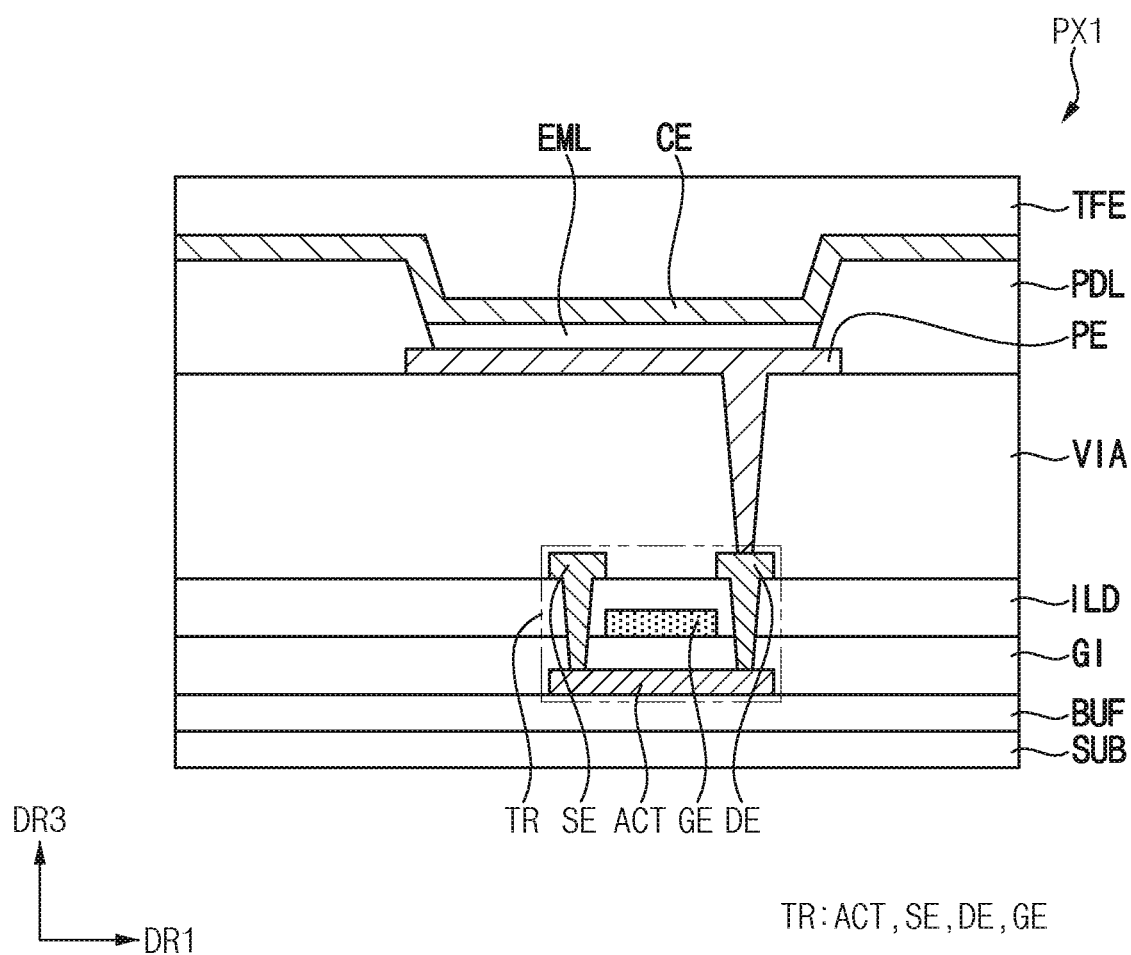
FIG. 4 is a cross-sectional view illustrating an embodiment of a pixel included in the display device of FIG. 1.

FIG. 4 is a cross-sectional view illustrating an embodiment of pixel PX1 included in the display device of FIG. 1. Referring to FIG. 4, the first pixel PX1 may include a substrate SUB, a buffer layer BUF, a gate insulating layer GI, an interlayer insulating layer ILD, a via insulating layer VIA, an active pattern ACT, a source electrode SE, a gate electrode GE, a drain electrode DE, a pixel electrode PE, a pixel defining layer PDL, a light emitting layer EML, a common electrode CE, and an encapsulating layer TFE.

The transistor TR may include an active pattern ACT, a source electrode SE, a gate electrode GE, and a drain electrode DE. For example, the transistor TR may be the first transistor T1 of FIG. 3.

The substrate SUB may include a transparent material or an opaque material. The substrate SUB may be formed of a transparent resin substrate. An example of the transparent resin substrate is a polyimide substrate. In this case, the polyimide substrate may include a first organic layer, a first barrier layer, a second organic layer, or the like. In one embodiment, the substrate SUB may include a quartz substrate, a synthetic quartz substrate, a calcium fluoride substrate, a fluorine-doped quartz substrate, a sodalime substrate, a non-alkali glass substrate, or the like. These materials may be used alone or in combination with each other.

The buffer layer BUF may be disposed on the substrate SUB. The buffer layer BUF may prevent metal atoms or impurities from diffusing from the substrate SUB to the transistor TR. In addition, the buffer layer BUF can improve the flatness of (or planarize) a surface of the substrate SUB when the surface of the substrate SUB is not uniform. For example, the buffer layer BUF may include an inorganic material such as silicon oxide, silicon nitride, silicon oxynitride, or the like. These materials may be used alone or in combination with each other.

The active layer ACT may be disposed on the buffer layer BUF. The active layer ACT may include a metal oxide semiconductor, an inorganic semiconductor (e.g., amorphous silicon, polysilicon), an organic semiconductor, or the like. These materials may be used alone or in combination with each other. The active layer ACT may include a source area, a drain area, and a channel area disposed between the source area and the drain area.

The metal oxide semiconductor may include a binary compound ($AB_x$), a ternary compound ($AB_xC_y$), a tetragonal compound ($AB_xC_yD_z$), or the like including indium (In), zinc (Zn), gallium (Ga), tin (Sn), titanium (Ti), aluminum (Al), hafnium (Hf), zirconium (Zr), magnesium (Mg), or the like. For example, the metal oxide semiconductor may include zinc oxide ($ZnO_x$), gallium oxide ($GaO_x$), tin oxide ($SnO_x$), indium oxide ($InO_x$), indium gallium oxide (IGO), indium zinc oxide (IZO), indium tin oxide (ITO), indium zinc tin oxide (IZTO), and indium gallium zinc oxide (IGZO). These materials may be used alone or in combination with each other.

The gate insulating layer GI may be disposed on the buffer layer BUF. The gate insulating layer GI may sufficiently cover the active layer ACT. In addition, the gate insulating layer GI may cover the active layer ACT and may be disposed along a profile of the active layer ACT. For example, the gate insulating layer GI may include inorganic materials such as silicon oxide ($SiO_x$), silicon nitride ($SiN_x$), silicon carbide ($SiC_x$), silicon oxynitride ($SiO_xN_y$), silicon oxycarbide ($SiO_xC_y$), or the like. These materials may be used alone or in combination with each other.

The gate electrode GE may be disposed on the gate insulating layer GI. The gate electrode GE may overlap the channel area of the active layer ACT. The gate electrode GE may include a metal, an alloy metal nitride, a conductive metal oxide, a transparent conductive material, or the like. Examples of the metal may include silver (Ag), molybdenum (Mo), aluminum (Al), tungsten (W), copper (Cu), nickel (Ni), chromium (Cr), titanium (Ti), tantalum (Ta), platinum (Pt), scandium (Sc), or the like. These materials may be used alone or in combination with each other. Examples of the conductive metal oxide may include Indium tin oxide, indium zinc oxide, or the like. In addition, examples of the metal nitride may include aluminum nitride ($AlN_x$), tungsten nitride ($WN_x$), chromium nitride ($CrN_x$), or the like. These materials may be used alone or in combination with each other.

The interlayer insulating layer ILD may be disposed on the gate insulating layer GI. The interlayer insulating layer ILD may sufficiently cover the gate electrode GE. In addition, the interlayer insulating layer ILD may cover the gate electrode GE, and may be disposed along a profile of the gate electrode GE. For example, the interlayer insulating layer ILD may include inorganic materials such as silicon oxide, silicon nitride, silicon carbide, silicon oxynitride, silicon oxycarbide, or the like. These materials may be used alone or in combination with each other.

The source electrode SE may be disposed on the interlayer insulating layer ILD. The source electrode SE may be connected to the source area of the active layer ACT through a contact hole penetrating the gate insulating layer GI and the interlayer insulating layer ILD.

The drain electrode DE may be disposed on the interlayer insulating layer ILD. The drain electrode DE may be connected to the drain area of the active layer ACT through a contact hole penetrating the gate insulating layer GI and the interlayer insulating layer ILD.

For example, the source electrode SE may include a metal, an alloy, a metal nitride, a conductive metal oxide, a transparent conductive material, or the like. These materials may be used alone or in combination with each other. The drain electrode DE may be formed through the same process used to form the source electrode SE and may include the same material as the source electrode SE.

The via insulating layer VIA may be disposed on the interlayer insulating layer ILD. The via insulating layer VIA may sufficiently cover the source electrode SE and the drain electrode DE. The via insulating layer VIA may include an organic material. For example, the via insulating layer VIA may include organic materials such as phenolic resin, acrylic resin, polyimide resin, polyamide resin, siloxane resin, epoxy resin, or the like. These materials may be used alone or in combination with each other.

The pixel electrode PE may be disposed on the via insulating layer VIA. The pixel electrode PE may be connected to the drain electrode DE through a contact hole penetrating the via insulating layer VIA. The pixel electrode PE may include a metal, an alloy, a metal nitride, a conductive metal oxide, a transparent conductive material, or the like. These materials be used alone or in combination with each other. In an embodiment, the pixel electrode PE may have a stacked structure including ITO/Ag/ITO. For example, the pixel electrode PE may operate as an anode.

The pixel defining layer PDL may be disposed on the via insulating layer VIA. The pixel defining layer PDL may cover both side portions of the pixel electrode PE. In addition, an opening exposing a portion of the upper surface of the pixel electrode PE may be provided in the pixel defining layer PDL. For example, the pixel defining layer PDL may include an inorganic material or an organic material. In an embodiment, the pixel defining layer PDL may include an organic material such as an epoxy resin, a siloxane resin, or the like. These materials may be used alone or in combination with each other. In another embodiment, the pixel defining layer PDL may further include a light blocking material containing a black pigment, a black dye, or the like.

The light emitting layer EML may be disposed on the pixel electrode PE. The light emitting layer EML may include an organic material that emits light of a preset color. For example, the light emitting layer EML may include an organic material that emits red light. However, the present disclosure is not limited thereto, and the light emitting layer EML may emit light of a different color from red light in another embodiment.

The common electrode CE may be disposed on the light emitting layer EML and the pixel defining layer PDL. The common electrode CE may include a metal, an alloy, a metal nitride, a conductive metal oxide, a transparent conductive material, or the like. These materials may be used alone or in combination with each other. The common electrode CE may operate as a cathode.

An encapsulation layer TFE may be disposed on the common electrode CE. The encapsulation layer TFE may prevent impurities and moisture from penetrating into the pixel electrode PE, the light emitting layer EML, and the common electrode CE from the outside. The encapsulation layer TFE may include at least one inorganic layer and at least one organic layer. For example, the inorganic layer may include silicon oxide, silicon nitride, silicon oxynitride, or the like. These materials may be used alone or in combination with each other. The organic layer may include a polymer cured product such as polyacrylate.

Although an exemplary embodiment of the first pixel PX1 has been described with reference to FIG. 4, the first pixel PX1 is not limited to the structure shown in FIG. 4. That is, the first pixel PX1 may include all structures that receive an electrical signal and emit light having a luminance corresponding to the intensity of the electrical signal.

FIG. 5 is a flowchart illustrating a method of aging a display device according to an embodiment.

Referring to FIGS. 1 to 5, the method initially includes inputting the display device DD into an aging chamber S1. This may be performed manually or with automated equipment. The display device DD may include the plurality of pixels. For example, the display device DD may include the first pixel PX1 and the second pixel PX2. An aging process of the display device DD may be performed inside the aging chamber.

The light emitting element EE of the display device DD may deteriorate as light emitting time increases. As a result, the lifespan of the display device DD may be reduced, and light efficiency may be reduced. To prevent this, the aging process may be performed. The aging process may include a process of accelerating initial luminance reduction by emitting the pixels of the display panel for a preset time. Thus, the aging process may include a process of forcibly deteriorating the display device DD.

During the aging process, a driving current may flow through the transistor TR. For example, the driving current may flow through the first transistor T1. The driving current may flow between the drain electrode DE and the source electrode SE of the transistor TR.

Each of the plurality of pixels may include a transistor TR. The transistors TR included in the plurality of pixels may have different threshold voltages Vth. For example, a threshold voltage of the transistor TR included in the first pixel PX1 may be different from a threshold voltage of the transistor included in the second pixel PX2. Accordingly, different driving currents may flow through the transistors TR included in the plurality of pixels. For example, the magnitude of a driving current flowing in the transistor TR included in the first pixel PX1 may be different from the magnitude of a driving current flowing in the transistor included in the second pixel PX2.

Accordingly, aging effect may not be uniform over the plurality of pixels. This may shorten the useful life of the display device DD. To prevent this, the method of aging the display device DD according to an embodiment may include sensing each of the plurality of pixels in operation S3 and compensating each of the plurality of pixels in operation S4. For example, the method of aging the display device DD according to an embodiment may include sensing and compensating the transistor TR included in each of the plurality of pixels.

In an embodiment, the method of aging the display device DD according to an embodiment may include reaching a preset condition of the display device DD in operation S2 before sensing each of the plurality of pixels in operation S3. For example, reaching the preset condition of the display device DD in operation S2 may include reaching a preset temperature of the display device DD.

Temperature inside the aging chamber may be higher than the temperature outside the aging chamber. Accordingly, the temperature of the display device DD disposed inside the aging chamber may increase. The display device DD may be heated for a preset time to reach a preset temperature. The preset temperature may be higher than an internal temperature of the aging chamber. For example, the temperature inside the aging chamber may be about 55° C. In addition, the display device DD may be heated for about 2 hours to reach a temperature of about 70° C. However, this is only an exemplary value, and the temperature inside the aging chamber, the preset time, and the preset temperature may be different in other embodiments.

The threshold voltage of the transistor TR may vary according to temperature. When the display device DD reaches the preset temperature, the temperature of the display device DD may not change any more. In one embodiment, the temperature of the display device DD may be lower than or equal to the preset temperature. Accordingly, the value of the threshold voltage may be fixed. Accordingly, the transistor TR may be sensed and compensated with high precision.

After reaching the preset condition of the display device DD in operation S2, automatically sensing each of the plurality of pixels S3 may proceed. For example, sensing the transistor TR included in each of the plurality of pixels may proceed. For example, sensing the first (driving) transistor T1 included in each of the plurality of pixels may proceed.

In one embodiment, the sensing unit 500 may generate the initialization voltage VINT. The sensing unit 500 may output the initialization voltage VINT to the sensing line SL. Accordingly, the sensing unit 500 may measure electrical characteristics of each of the plurality of pixels. For example, the sensing unit 500 may measure electrical characteristics of each of the first pixel PX1 and the second pixel PX2.

In an embodiment, the sensing unit 500 may measure the driving current of the transistor TR included in each of the plurality of pixels. For example, the sensing unit 500 may measure the driving current flowing between the drain electrode DE and the source electrode SE of the transistor TR included in each of the plurality of pixels. For example, the sensing unit 500 may measure the driving current of the transistor TR included in each of the first pixel PX1 and the second pixel PX2.

However, this disclosure is not limited thereto. In another embodiment, the sensing unit 500 may measure a driving voltage of the transistor TR included in each of the plurality of pixels. For example, the sensing unit 500 may measure a driving voltage of the transistor TR included in each of the first pixel PX1 and the second pixel PX2. Thus, the sensing unit 500 may measure electrical characteristics such as driving current, driving voltage, or the like, of the transistor TR.

After sensing each of the plurality of pixels is performed in operation S3, compensating each of the plurality of pixels in operation S4 may proceed. The sensing unit 500 may generate sensing data S-DATA based on the measured electrical characteristics. The sensing unit 500 may output the sensing data S-DATA to the compensation unit 600.

The compensation unit 600 may calculate a compensation value for compensating each of the plurality of pixels based on the sensing data S-DATA. For example, the compensation unit 600 may calculate a compensation value for compensating each of the first pixel PX1 and the second pixel PX2. The compensation unit 600 may generate compensation data V-DATA based on the compensation value. The compensation unit 600 may output the compensation data V-DATA to the data driver 400. Accordingly, the data driver 400 may generate an adjusted data voltage DATA.

Thereafter, aging the display device DD S5 may proceed. Aging the display device DD S5 may proceed by applying the adjusted data voltage DATA to each of the plurality of pixels. For example, the data driver 400 may apply the adjusted data voltage DATA to the first pixel PX1 through the first data line DL1. In addition, the data driver 400 may apply the adjusted data voltage DATA to the second pixel PX2 through the second data line DL2.

Accordingly, a driving current having substantially the same value may flow in the transistor TR included in each of the plurality of pixels. For example, the value of the driving current flowing through the transistor TR included in the first pixel PX1 may be substantially the same as the value of the driving current flowing through the transistor included in the second pixel PX2. Accordingly, the aging effect may be constant over the plurality of pixels.

The method of aging the display device DD according to an embodiment may proceed without additional facilities and manual intervention. For example, reaching the preset condition of the display device DD in operation S2, sensing each of the plurality of pixels in operation S3, and compensating each of the plurality of pixels in operation S4 may automatically proceed without additional facilities and manual intervention. Accordingly, there may be no need to secure additional facility space. In addition, the cost of the aging process of the display device DD may be reduced.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims. The embodiments may be combined to form additional embodiments.

What is claimed is:

1. A method of aging a display device, the method comprising:
    reaching a preset condition of the display device in an aging chamber;
    sensing at least one electrical characteristic of each of a plurality of pixels of the display device;
    compensating each of the plurality of pixels; and
    aging the display device, wherein a temperature inside the aging chamber is higher than a temperature outside the aging chamber.

2. The method of claim 1, wherein the reaching the preset condition of the display device includes reaching a preset temperature of the display device.

3. The method of claim 2, wherein the preset temperature is higher than internal temperature of the aging chamber.

4. The method of claim 2, wherein the display device is heated inside the aging chamber for a predetermined time to reach the predetermined temperature.

5. The method of claim 2, wherein temperature of the display device is lower than or equal to the preset temperature.

6. The method of claim 1, wherein each of the plurality of pixels includes a transistor.

7. The method of claim 6, wherein the transistor includes a source electrode, a drain electrode, a gate electrode, and an active pattern.

8. The method of claim 7, wherein the display device further includes a sensing unit to sense the at least one electrical characteristic of each of the plurality of pixels.

9. The method of claim 8, wherein sensing the at least one electrical characteristic of each of the plurality of pixels includes measuring at least one electrical characteristic of the transistor using the sensing unit.

10. The method of claim 9, wherein the transistor is a driving transistor.

11. The method of claim 10, wherein the at least one electrical characteristic is a driving current flowing between the source electrode and the drain electrode of the transistor.

12. The method of claim 11, wherein the display device further includes a compensation unit and a data driver.

13. The method of claim 12, wherein compensating each of the plurality of pixels includes generating sensing data based on the measured at least one electrical characteristic using the sensing unit.

14. The method of claim 13, wherein compensating each of the plurality of pixels further includes outputting the sensing data to the compensation unit by using the sensing unit.

15. The method of claim 14, wherein compensating each of the plurality of pixels further includes calculating a compensation value based on the sensing data by using the compensation unit.

16. The method of claim 15, wherein compensating each of the plurality of pixels further includes generating compensation data based on the compensation value using the compensation unit.

17. The method of claim 16, wherein compensating each of the plurality of pixels further includes outputting the compensation data to the data driver using the compensation unit.

18. The method of claim 17, wherein aging the display device includes adjusting a data voltage based on the compensation data using the data driver.

19. The method of claim 18, wherein aging the display device further includes applying the adjusted data voltage to each of the plurality of pixels by using the data driver.

20. The method of claim 2, wherein the preset temperature corresponds to a temperature where threshold voltages of driving transistors in the plurality of pixels of the display device no longer change with subsequent changes in temperature.

21. A method for aging a display device, comprising:
    heating the display device to a preset temperature in an aging chamber;
    sensing driving current in each of a plurality of pixels in the display device;
    generating compensation data based on the driving current sensed for each of the plurality of pixels; and
    generating adjusted data for the plurality of pixels based on the compensation data,
    wherein a temperature inside the aging chamber is higher than a temperature outside the aging chamber, and
    wherein the adjusted data causes the driving current in each of the plurality of pixels to substantially equal one another.

* * * * *